United States Patent
Wang et al.

(10) Patent No.: US 8,970,284 B2
(45) Date of Patent: Mar. 3, 2015

(54) RECEIVER CIRCUIT

(75) Inventors: Wen-Tai Wang, Hsinchu County (TW); Sheng-Tsai Huang, Hsinchu County (TW); Chao-Yen Huang, Taipei (TW)

(73) Assignees: Global Unichip Corporation, Hsinchu (TW); Taiwan Semiconductor Manufacturing Co., Ltd., Hsin-Chu (TW)

( * ) Notice: Subject to any disclaimer, the term of this patent is extended or adjusted under 35 U.S.C. 154(b) by 222 days.

(21) Appl. No.: 13/409,304

(22) Filed: Mar. 1, 2012

(65) Prior Publication Data

US 2012/0223759 A1     Sep. 6, 2012

(30) Foreign Application Priority Data

Mar. 2, 2011 (TW) .............................. 100106973 A

(51) Int. Cl.
H03L 5/00 (2006.01)
H03K 19/0185 (2006.01)
(52) U.S. Cl.
CPC .............................. *H03K 19/018521* (2013.01)
USPC ............................................ 327/333; 326/62
(58) Field of Classification Search
USPC ....................... 327/427, 108, 112, 333; 326/62
See application file for complete search history.

(56) References Cited

U.S. PATENT DOCUMENTS

| 6,724,226 | B2 | 4/2004 | Kim |
| 7,190,206 | B2 * | 3/2007 | Lee et al. ....................... 327/333 |
| 7,564,317 | B2 | 7/2009 | Ker et al. |
| 8,570,091 | B2 * | 10/2013 | Lee et al. ....................... 327/333 |
| 2007/0145421 | A1 | 6/2007 | Jin |

OTHER PUBLICATIONS

Hector Sanchez et al., "A Versatile 3.3/2.5/1.8-V CMOS I/O Driver Built in a 0.2-µm , 3.5-nm Tox, 1.8-V CMOS Technology", Nov. 1999, pp. 1501-1511, vol. 34, IEEE Journal of Solid-State Circuits.
Anne-Johan Annema et al., "5.5V Tolerant I/O in a 2.5V 0.25 µm CMOS Technology", 2000, pp. 417-420, IEEE 2000 Custom Integrated Circuits Conference.
Chen et al., "A New Schmitt Trigger Circuit in a 0.13-µm 1/2.5-V CMOS Process to Receive 3.3-V Input Signals", Jul. 2005, pp. 361-365, vol. 52, IEEE Transactions on Circuits and Systems—II: Express Briefs.
Anne-Johan Annema et al., "5.5-V I/O in a 2.5-V 0.25-µm CMOS technology," Solid-State Circuits, IEEE Journal of, vol. 36, No. 3, pp. 528, 538, Mar. 2001.
Taiwan Intellectual Property Office, "Office Action", Mar. 18, 2014.
State Intellectual Property Office of the People's Republic of China, "Office Action", Feb. 25, 2014.

* cited by examiner

*Primary Examiner* — Hai L Nguyen
(74) *Attorney, Agent, or Firm* — WPAT, PC; Justin King

(57) ABSTRACT

A receiver circuit is provided which receives an external signal of high voltage and provides a corresponding internal signal of low voltage. The receiver circuit includes a voltage limiter, a level down shifter and an inverter of low operation voltage. The level down shifter has a front node and a back node, and includes a transistor with a gate and a source respectively coupled to the voltage limiter and the inverter at the front node and the back node. The voltage limiter limits level of the external signal transmitted to the front node, the level down shifter shifts down a signal of the front node by a cross voltage to generate a signal of the back node, and the inverter inverts the signal of the back node to generate the internal signal.

11 Claims, 2 Drawing Sheets

RECEIVER CIRCUIT

This application claims the benefit of Taiwan Patent Application No. 100106973, filed Mar. 02, 2011, the subject matter of which is incorporated herein by reference.

FIELD OF THE INVENTION

The present invention relates to a receiver circuit, and more particularly, to a receiver circuit applying level down shifter.

BACKGROUND OF THE INVENTION

Semiconductor chips (dice/integrated circuits) are the most import hardware bases of modern information society; chips of different functionalities integrate to form an electronic system of multiple functions. To integrate functionalities of various chips, chips exchange data and signals mutually. Therefore, each chip includes receiver circuit for receiving signals transmitted by other chip(s).

Because signal between chips transmits across a circuit board, signal transmitted and received by chips has a swing range of higher voltage, e.g., a range between 0 and 3.3 Volts with 3.3 Volts representing logic 1 and 0 Volts representing logic 0.

On the other hand, as semiconductor manufacturing process evolves toward advanced process of deep semi-micron, modern chips adopt devices (transistors) of low voltage to build circuits, e.g., use low voltage devices of 1.8 Volts to construct various circuits operating between 0 and 1.8 Volts, such as inverters of 1.8 Volts. Correspondingly, signal in such circuits has a swing range of lower voltage, such as a range between 0 and 1.8 Volts with 1.8 Volts representing logic 1 and 0 Volts representing logic 0.

Low voltage devices have many application advantages, for example, each low voltage device occupies less layout area, so chip integration can be increased; moreover, low voltage devices operate under lower supply voltage to achieve high-speed operations with low power consumption.

However, tolerable voltages of low voltage device are also lower. For example, in a low voltage metal-oxide-semiconductor (MOS) transistor, voltage difference between gate and source, as well as voltage difference between gate and drain, can not be too large, or the thin gate oxide of low voltage device will be damaged.

Therefore, if low voltage devices are adopted to establish a receiver circuit for receiving high voltage signals (signals of high voltage swing range), various circuit design difficulties need to be solved. Modern prior arts usually adopt high voltage devices (such as MOS transistors of thick oxide) to construct receiver circuits.

In a prior art receiver circuit, an external signal of high voltage is received to an inverter operating in low supply voltage through a drain and a source of a MOS transistor, so the external signal is inverted to an internal signal of low voltage; for example, a 3.3 Volts external signal is transmitted to a 1.8 Volts inverter through the MOS transistor, so a corresponding 1.8 Volts internal signal is generated. For the MOS transistor, one of its drain and source is coupled to a pad for receiving the external signal from exterior of the chip, and the other is coupled to the inverter; when the external signal transmits to the inverter through the drain and the source, the MOS transistor limits a voltage upper bound of the external signal according to gate bias of the MOS transistor, so the upper bound is lower than 3.3 Volts to be safely received by the inverter.

In the aforementioned prior art, because the MOS transistor can only limit the upper bound of the external signal but can not adjust a transition voltage of the external signal, a transition voltage of the inverter needs to be adjusted. For example, an external signal of 3.3 Volts transits between logic 0 and logic 1 at a transition voltage of 1.65 Volts, but a transition voltage triggers logic transition of a 1.8 Volts inverter is 0.9 Volts; difference between the two transition voltages is overwhelming. In advanced process, the difference between the transition voltage of low voltage inverter and the transition voltage of high voltage signal has become too great to be effectively settled through circuit design.

In another kind prior art receiver circuit, low voltage devices are stacked in cascode to reduce voltages tolerated by each low voltage device. However, such kind receiver circuit suffers from high circuit complexity, also causes dead zones appeared in its input to output transfer curve, hence its transfer characteristics and noise immunity are degraded.

SUMMARY OF THE INVENTION

Therefore, the present invention provides an improved receiver circuit to solve disadvantages of the prior arts.

An objective of the invention is to provide a receiver circuit capable of receiving an external signal of high voltage and providing a corresponding internal signal of low voltage in response. A swing range of the external signal corresponds to a range between a first supply voltage and a basic supply voltage, a swing range of the internal signal corresponds to a range between a second supply voltage and the basic supply voltage, wherein the second supply voltage is lower (less) than the first supply voltage. The receiver circuit has an external node coupled to the external signal through a pad for external connection, and includes a voltage limiter, a level down shifter, a discharge circuit and an inverter. The voltage limiter, the level down shifter, the discharge circuit and the inverter can be formed by low voltage devices which operate under low (supply) voltage, i.e., operate between the second supply voltage and the basic supply voltage.

In the receiver circuit of the invention, the level down shifter has a front node and a back node respectively coupled to the external node and the inverter. The level down shifter transmits signal from the front node to the back node; when a signal of the front node transmits to the back node, the level down shifter shifts down the signal of front node by a cross voltage to generate a signal of the back node. The inverter inverts the signal of the back node to generate the internal signal. With such arrangement, the level down shifter shifts down the transition voltage of the front node signal to effectively match the transition voltage of the inverter. Equivalently, the level down shifter shifts up the transition voltage of the inverter to fit the transition voltage of the front node signal, and thus disadvantages of prior arts are overcome.

In an embodiment, the level down shifter includes a transistor (e.g., an n-channel MOS transistor) and a load element (e.g., a resistor). A gate, a drain and a source of the transistor are respectively coupled to the front node, the second supply voltage and the back node. The load element is coupled between the back node and the basic supply voltage. The level down shifter utilizes a cross voltage between the gate and the source of the transistor to shift down the front node signal to the back node signal.

The voltage limiter is coupled between the external node and the front node, and has a first transmitting node and a second transmitting node respectively coupled to the external node and the front node. The voltage limiter transmits signal between the first transmitting node and the second transmitting node; when a signal of the first transmitting node transmits to the second transmitting node, if the signal of the first transmitting node is less (lower) than a reference level, the voltage limiter causes a signal of the second transmitting node to track the signal of the first transmitting node; if the signal of the first transmitting node is higher (greater) than the reference level, the voltage limiter causes the signal of the second transmitting node to fix to a limiting level. That is, the voltage limiter limits signal upper bound of the front node to protect the level down shifter.

In an embodiment, the voltage limiter includes a first transistor and a fourth transistor for signal transmission, and a boost circuit. The boost circuit has a bias node and includes a second transistor and a third transistor. The first transistor can be an n-channel MOS transistor, and the fourth transistor can be a MOS transistor of a native device. Sources and drains of the first transistor and the fourth transistor are coupled between the first transmitting node and the second transmitting node, a gate of the first transistor is coupled to the bias node of the boost circuit and receives a bias voltage provided by the boost circuit; a gate of the fourth transistor is coupled to the second supply voltage.

The first transistor corresponds to a threshold voltage. When voltage signal of the first transmitting node rises to the first supply voltage, the bias voltage provided to the gate of the first transistor by the boost circuit also approaches the first supply voltage. Consequently, operation of the first transistor sets the signal upper bound of the second transmitting node to the limiting level; the limiting level then corresponds to a difference between the first supply voltage and the threshold voltage.

In the boost circuit, the second transistor and the third transistor can be p-channel MOS transistors. A gate of the second transistor is coupled to the second supply voltage, one of a source and a drain of the second transistor is coupled to the first transmitting node and the other is coupled to the bias node. A gate of the third transistor is coupled to the first transmitting node, one of a source and a drain of the third transistor is coupled to the second supply voltage and the other is coupled to the bias node.

The discharge circuit has a first coupling node and a second coupling node, the first coupling node is coupled to the second transmitting node of the voltage limiter, so a leakage current due to sub-threshold conduction of the first transistor of the voltage limiter is conducted to the second coupling node, and voltage of the second transmitting node is prevented from being charged above the limiting level by the leakage current. In an embodiment, the second coupling node is coupled to the basic supply voltage, and the discharge circuit is implemented by a resistor coupled between the first coupling node and the second coupling node, such that the leakage current is conducted to the basic supply voltage.

In another embodiment of the discharge circuit, the second coupling node is coupled to the second supply voltage. The discharge circuit includes a resistor and three transistors (e.g., p-channel MOS transistors). A gate of one of the transistors is coupled to the second coupling node, one of a source and a drain of the transistor is coupled to a first node, the other is coupled to a second node. A gate of a second one of the transistors is coupled to the first node, one of a source and a drain of the transistor is coupled to the second node, the other is coupled to the second coupling node. A gate of another one of the transistors is coupled to the second coupling node, one of a source and a drain of the transistor is coupled to the first node or the second node, the other is coupled to the second coupling node. The resistor is coupled between the first node and the first coupling node.

In an embodiment of the discharge circuit, a diode and a resistor are included; an anode of the diode is coupled to a first node and a cathode of the diode is coupled to the second coupling node, and the resistor is coupled between the first node and the first coupling node.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1:
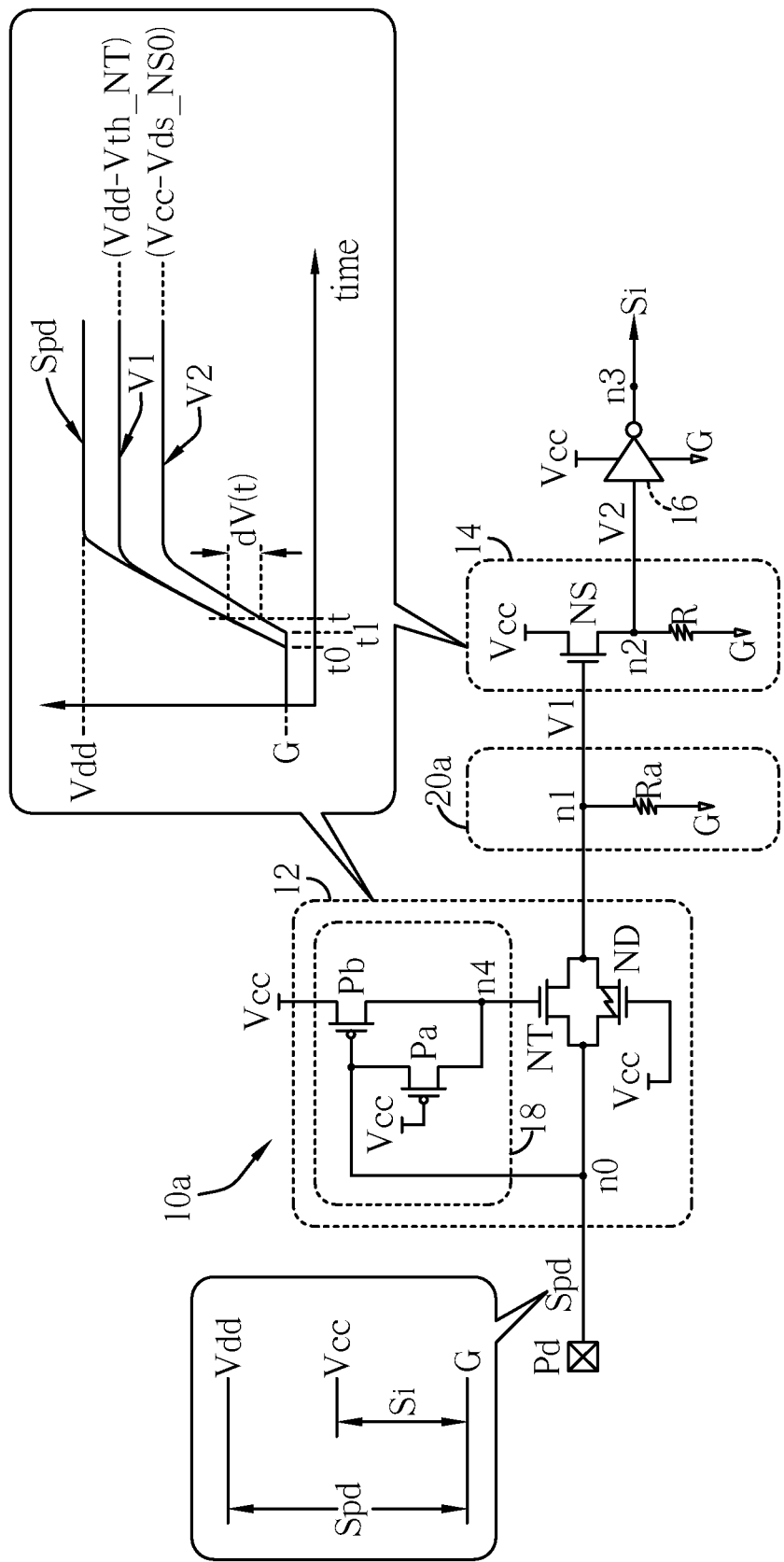
FIG. 1 and FIG. 2 illustrate receiver circuits according different embodiments of the invention.

Please refer to FIG. 1 illustrating a receiver circuit 10a according to an embodiment of the invention, which receives a signal Spd through a pad Pd and provides a corresponding signal Si at a node n3 in response. The signal Spd can be an external signal of high voltage, with a swing range between supply voltages Vdd and G; the signal Si can be an internal signal of low voltage, with a swing range between supply voltages Vcc and G. The supply voltage Vdd can be higher (greater) than the supply voltage Vcc; for example, the supply voltages Vdd and Vcc are 3.3 and 1.8 Volts, respectively. The supply voltage G is a basic supply voltage, such as a ground supply voltage of 0 Volts.

The receiver circuit 10a has a node n0 as an external node which is coupled to the signal Spd through the pad Pd, and includes a voltage limiter 12, a level down shifter 14, a discharge circuit 20a and an inverter 16. The voltage limiter 12, the level down shifter 14, the discharge circuit 20a and the inverter 16 can be formed by low voltage devices to operate under low voltage, i.e., operate between the supply voltages Vcc and G.

In the receiver circuit 10a, nodes n0 and n1 respectively function as a first transmitting node and a second transmitting node of the voltage limiter 12; nodes n1 and n2 work as a front node and a back node of the level down shifter 14, respectively. The voltage limiter 12 includes two transistors NT and ND for transmitting signal, also includes a boost circuit 18. The boost circuit 18 forms a bias node at node n4, and includes transistors Pa and Pb.

Sources and drains of the transistors NT and ND are coupled between the nodes n0 and n1; the transistor NT can be an n-channel MOS transistor with a gate coupled to the boost circuit 18 at the node n4 for receiving bias control provided by the boost circuit 18. The transistor ND can be a MOS transistor of a native device, its gate is coupled to the supply voltage Vcc. A channel between a drain and a source of the transistor ND is not doped with carriers, so a threshold voltage to turn on the transistor ND approaches 0 Volts. Alternatively, the transistor ND can be a p-channel MOS transistor.

The transistors Pa and Pb in the boost circuit 18 can be p-channel MOS transistors. A gate of the transistor Pa is coupled to the supply voltage Vcc, one of a source and a drain of the transistor Pa is coupled to the node n0, the other is coupled to the node n4. A gate of the transistor Pb is coupled to the node n0, one of a source and a drain of the transistor Pb is coupled to the supply voltage Vcc, the other is coupled to the node n4.

The level down shifter 14 includes a transistor NS and a resistor R. The transistor NS can be an n-channel MOS transistor with a gate, a drain and a source respectively coupled to the node n1, the supply voltage Vcc and the node n2. The resistor R functions as a load element, and is coupled between the node n2 and the supply voltage G. The inverter 16 is coupled to the node n2, and inverts a signal V2 of the node n2 to generate the signal Si of the node n3.

In the embodiment of FIG. 1, the discharge circuit 20a is implemented by a resistor Ra; the resistor Ra is coupled between the node n1 and the supply voltage G.

Operation of the receiver circuit 10a can be described as follows. When the signal Spd transmits to the node n0 of the voltage limiter 12, if level (voltage) of the signal Spd is lower than the supply voltage Vcc, the transistor ND turns on, so the signal Spd is directly transmitted to the node n1. That is, when the signal Spd is lower than the supply voltage Vcc, the transistor ND causes the signal V1 of the node n1 to track the signal Spd of the node n0. For the boost circuit 18, when level of the signal Spd is lower than voltage (Vcc−|Vth_Pb|), the transistor Pb turns on, and voltage of the node n4 is kept at the supply voltage Vcc; wherein the voltage |Vth_Pb| is the threshold voltage of the transistor Pb.

Because the transistor ND is a native device, even when the signal Spd equals the supply voltage Vcc, the transistor ND maintains a certain conduction ability to transmit the signal Spd to the node n1. According to threshold voltage |Vth_Pa| of the transistor Pa, if level of the signal Spd is higher than voltage (Vcc+|Vth_Pa|), the transistor Pa conducts the node n0 to the node n4, the transistor NT turns on, so the signal Spd is transmitted to the node n1. Based on the threshold voltage Vth_NT of the transistor NT, if level of the signal Spd is higher than voltage (Vdd−Vth_NT) and approaches the supply voltage Vdd, the signal V1 of the node n1 will be kept at voltage (Vdd−Vth_NT) due to cross voltage between gate and source/drain of the transistor NT.

That is, when the signal Spd of the node n0 transmits to the node n1, if the signal Spd is lower than a reference level of voltage (Vdd−Vth_NT), at least one of the transistors NT and ND in the voltage limiter 12 will turn on, such that the signal V1 of the node n1 can track the signal Spd. If the signal Spd is higher than the reference level, the transistor NT in the voltage limiter 12 causes the signal V1 of the node n1 fixed to a limiting level, i.e., voltage (Vdd−Vth_NT). In other words, the voltage limiter 12 limits signal upper bound while transmitting the signal Spd to become the signal V1 of the node n1, such that a voltage difference between the node n1 and the supply voltage Vcc is clamped to a tolerable value insufficient to damage gate oxide of the transistor NS, and then the level down shifter 14 is protected.

When the signal V1 is higher than a threshold voltage Vth_NS of the transistor NS, the transistor NS turns on and establishes a signal V2 at the node n2 of the resistor R. The inverter 16 inverts the signal V2 to generate the internal signal Si, such that a swing range of the signal Si matches a range between the supply voltages Vcc to G.

Because the level down shifter 14 shifts down the transition voltage of the signal V1, the shifted transition voltage effectively matches the transition voltage of the inverter 16. Equivalently, the level down shifter 14 shifts up the transition voltage of the inverter 16 to match the transition voltage of the signal V1, and therefore pitfalls of the prior arts are overcome. Due to arrangement of the level down shifter 14, the transition voltage of the inverter 16 does not need to be adjusted; for example, the transition voltage can be (Vcc+G)/2.

As an example, FIG. 1 also shows timing and waveforms of the signals V1, V2 and Spd during a rising edge of the signal Spd; the transverse axis represents time, and the longitudinal axis is signal level (voltage). At time t0, the signal Spd starts to rise from the supply voltage G; during the rising progress, the voltage limiter 12 causes the signal V1 to track the signal Spd, and when the signal V1 approaches voltage (Vcc−Vth_NT), level of the signal V1 is limited to voltage (Vcc−Vth_Nt). Operation of the level down shifter 14 causes the signal V2 to start to rise at time t1, and to follow the rising tendency of the signal V1 with a voltage difference of the cross voltage dV(t) below the signal V1. At time t1, the cross voltage dV(t) approximates the threshold voltage |Vth_NS| of the transistor NS. As the signal rises close to voltage (Vdd−Vth_NT), level of the signal V2 is fixed to voltage (Vcc−Vds_NS0) due to saturation, wherein the voltage $Vds_{13}$ NS0, about 100 to 200 millivolts (mV), is a voltage between the drain and the source of the transistor NS when the transistor NS operates in saturation region. The cross voltage dV(t) is greater than the threshold voltage |Vth_NS|, but less than tolerable voltage of the transistor NS.

In the receiver circuit 10a of the invention, the discharge circuit 20a assists the voltage limiter 12 to protect the level down shifter 14. When the signal Spd is kept at a high voltage of the supply voltage Vdd, leakage current due to sub-threshold conduction of the transistor NT flows to, and charges, the node n1; if the charging continues, the signal V1 of the node n1 will grow higher than voltage (Vdd−Vth_NT), even reach the supply voltage Vdd, and thus the transistor NS is jeopardized. Therefore, the receiver circuit 10a is equipped with the discharge circuit 20a, so the leakage current to the node n1 can be conducted to the supply voltage G by the resistor Ra, and hence charges of the leakage current do not accumulate at the node n1 to affect voltage of the node n1. Resistance of the resistor Ra can be in an order of Mega-ohms, and it can be implemented by a channel of a MOS transistor. The discharge circuit 20 is suitable for conducting the leakage current to the supply voltage G, if the receiver circuit 10a is applied to a pad tied low.

Figure 2:
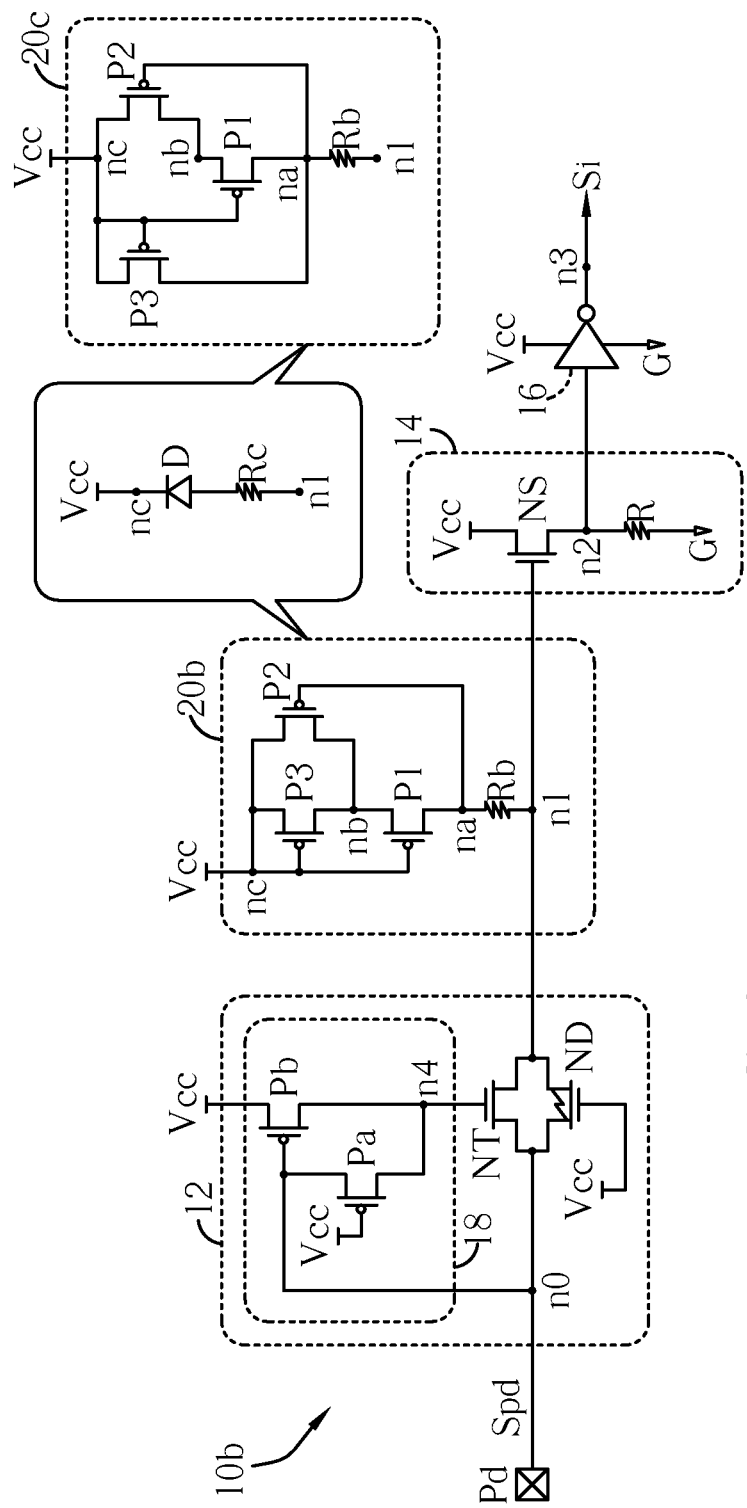

Following the embodiment of FIG. 1, please refer to FIG. 2 illustrating a receiver circuit 10b according to another embodiment of the invention. The receiver 10b adopts the voltage limiter 12, the level down shifter 14 and the inverter 16 of the receiver circuit 10a with similar operation principles, but utilizes a discharge circuit 20b to cooperate with the voltage limiter 12.

The discharge circuit 20b includes transistors P1 to P3 and a resistor Rb. The transistors P1 to P3 can be p-channel MOS transistors; the nodes n1 and nc are two coupling nodes of the discharge circuit 20b. For the transistor P1, its gate is coupled to the node nc, one of its drain and source is coupled to the node na, and the other is coupled to the node nb. For the transistor P2, its gate is coupled to the node na, one of its drain and source is coupled to the node nb, and the other is coupled to the node nc. For the transistor P3, its gate is coupled to the node nc, one of its drain and source is coupled to the node nb, and the other is coupled to the node nc. The resistor Rb is coupled between the nodes na and n1. FIG. 2 also illustrates an equivalent circuit of the discharge circuit 20b, whose functionality is represented by a diode D and a resistor Rc. A cathode of the diode D is coupled to the supply voltage Vcc at the node nc, and an anode is coupled to the node n1 through the resistor Rc. When voltage of the node n1 exceeds the supply voltage Vcc owing to charging of the leakage current, the diode D conducts the node n1 to the node nc through forward biasing, thus the leakage current is conducted to the supply voltage Vcc, and the transistor NS is prevented from charge accumulation at the node n1. The discharge circuit 20b is suitable for conducting the leakage current to the supply voltage Vcc if the receiver circuit 10a is applied to pad which is tied high.

FIG. 2 also illustrates another embodiment 20c of the discharge circuit. In the discharge circuit 20c, a source and a drain of the transistor P3 are coupled between the nodes na and nc. Of course, the discharge circuits 20b and 20c can be implemented by the diode D and the resistor Rc. The diode D can be a diode of pn junction, or implemented by a diode-connected p-channel MOS transistor. Functionality of the discharge circuit 20b/20c is coupling the node n1 to a bias voltage lower than voltage (Vdd−Vth_NT), any circuit with such functionality can be utilized ti implement the discharge circuit 20b.

Because the cooperation arrangement of the voltage limiter 12 and the discharge circuit 20a/20b/20c is capable of effectively controlling voltage of the node n1 to protect the level down shifter 14, the receiver circuit 10a/10b can be implemented by devices of lower voltage; for example, a receiver circuit capable of receiving 3.3 Volts signal can be built with devices of 1.5 Volts which operate under 1.5 Volts i.e., Vcc=1.5. On the other hand, if difference between the supply voltages Vdd and Vcc will not damage low voltage devices, the voltage limiter 12 and the discharge circuit 20a/20b can be excluded from the receiver circuit of the invention, i.e., the node n1 is directly coupled to the pad Pd.

In the embodiment of FIG. 1, the resistor Ra in the discharge circuit 20a can be excluded. In the embodiment of FIG. 2, the resistor Rb of the discharge circuit 20b/20c can also be excluded, so the nodes na and n1 merge. Each of the resistors Ra, Rb and Rc in the discharge circuit 20a/20b/20c can be implemented by a passive element or a transistor, e.g., a MOS transistor.

To sum up, comparing to prior arts, the invention utilizes level down shifter (in cooperation with voltage limiter and discharge circuit) to implement a simple but effective receiver circuit, which is capable of receiving high voltage signals with low supply circuit of low voltage devices; there is no need to adjust the transition voltage of the inverter, and no need to adopt transistor stack of high complexity.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A receiver circuit receiving an external signal and providing an internal signal in response, a swing range of the external signal corresponding to a range between a first supply voltage and a basic supply voltage, a swing range of the internal signal corresponding to a range between a second supply voltage and the basic supply voltage, the second supply voltage being lower than the first supply voltage, and the receiver circuit comprising:
   an external node coupled to the external signal;
   a level down shifter operating between the second supply voltage and the basic supply voltage, and having a front node and a back node; the front node being coupled to the external node, and the level down shifter comprising:
      a main transistor having a main gate, a main drain and a main source respectively coupled to the front node, the second supply voltage and the back node; wherein when a signal of the front node reaches a logic high level, the level down shifter is capable of causing a signal of the back node to approach the second supply voltage minus a cross voltage; and
   an inverter operating between the second supply voltage and the basic supply voltage, being coupled to the back node, and inverting the signal of the back node to generate the internal signal; and
   a voltage limiter coupled between the external node and the front node, and having a first transmitting node and second transmitting node respectively coupled to the external node and the front node; wherein if the signal of the first transmitting node is lower than a reference level, the voltage limiter causes a signal of the second transmitting node to track the signal of the first transmitting node; and if the signal of the first transmitting node is higher than the reference level, the voltage limiter causes the signal of the second transmitting node to fix to a limiting level;
   wherein the voltage limiter comprises:
      a first transistor having a first gate, a first source and a first drain, one of the first source and the first drain being coupled to the first transmitting node and the other being coupled to the second transmitting node;
      a second transistor having a second gate, a second source and a second drain; the second gate coupled to the second supply voltage, one of the second source and the second drain coupled to the first transmitting node and the other coupled to the first gate;
      a third transistor having a third gate, a third source and a third drain; the third gate coupled to the first transmitting node, one of the third source and the third drain coupled to the second supply voltage and the other coupled to the first gate; and
      a fourth transistor having a fourth gate, a fourth source and a fourth drain; the fourth gate coupled to the second supply voltage, one of the fourth source and the fourth drain coupled to the first transmitting node and the other coupled to the second transmitting node.

2. The receiver circuit as claimed in claim 1, wherein the level down shifter further comprises:
   a load element coupled between the back node and the basic supply voltage.

3. The receiver circuit as claimed in claim 1, wherein the first transistor corresponds to a threshold voltage, and the limiting level corresponds to a difference between the first supply voltage and the threshold voltage.

4. The receiver circuit as claimed in claim 1, wherein the fourth transistor is a native device.

5. The receiver circuit as claimed in claim 1 further comprising:
   a discharge circuit having a first coupling node and a second coupling node; the first coupling node coupled to the second transmitting node, the second coupling node coupled to one of the second supply voltage and the basic supply voltage, and the discharge circuit comprising:
      a resistor coupled between the first coupling node and the second coupling node.

6. The receiver circuit as claimed in claim 5, wherein the discharge circuit further comprises:
   a fifth transistor having a fifth gate, a fifth drain and a fifth source; the fifth gate coupled to the second coupling node, one of the fifth drain and the fifth source coupled to a first internal node and the other coupled to a second internal node;

a sixth transistor having a sixth gate, a sixth drain and a sixth source; the sixth gate coupled to the first node, one of the sixth drain and the sixth source coupled to the second internal node and the other coupled to the second coupling node; and a seventh transistor having a seventh gate, a seventh drain and a seventh source; the seventh gate coupled to the second coupling node, one of the seventh drain and the seventh source coupled to the second internal node and the other coupled to the second coupling node;

wherein the resistor is coupled between the first internal node and the first coupling node.

7. The receiver circuit as claimed in claim 5, wherein the second coupling node is coupled to the second supply voltage.

8. The receiver circuit as claimed in claim 5, wherein the discharge circuit further comprises:

a fifth transistor having a fifth gate, a fifth drain and a fifth source; the fifth gate coupled to the second coupling node, one of the fifth drain and the fifth source coupled to a first internal node and the other coupled to a second internal node;

a sixth transistor having a sixth gate, a sixth drain and a sixth source; the sixth gate coupled to the first internal node, one of the sixth drain and the sixth source coupled to the second internal node and the other coupled to the second coupling node; and a seventh transistor having a seventh gate, a seventh drain and a seventh source; the seventh gate coupled to the second coupling node, one of the seventh drain and the seventh source coupled to the first internal node and the other coupled to the second coupling node;

wherein the resistor is coupled between the first internal node and the first coupling node.

9. The receiver circuit of claim 5, wherein the discharge circuit further comprises:

a diode having an anode and a cathode; the anode coupled to a first internal node and the cathode coupled to the second coupling node;

wherein the resistor is coupled between the first internal node and the first coupling node.

10. The receiver circuit of claim 5, wherein the resistor in the discharge circuit is a passive element or a transistor.

11. A receiver circuit receiving an external signal and providing an internal signal in response, a swing range of the external signal corresponding to a range between a first supply voltage and a basic supply voltage, a swing range of the internal signal corresponding to a range between a second supply voltage and the basic supply voltage, the second supply voltage being lower than the first supply voltage, and the receiver circuit comprising:

an external node coupled to the external signal;

a level down shifter having a front node and a back node; the front node being coupled to the external node, and the level down shifter comprising: a main transistor having a main gate, a main drain and a main source respectively coupled to the front node, the second supply voltage and the back node;

an inverter operating between the second supply voltage and the basic supply voltage, being coupled to the back node, and inverting the signal of the back node to generate the internal signal; and a voltage limiter coupled between the external node and the front node, and having a first transmitting node and second transmitting node respectively coupled to the external node and the front node; the voltage limiter comprising:

a first transistor having a first gate, a first source and a first drain, one of the first source and the first drain being coupled to the first transmitting node and the other being coupled to the second transmitting node;

a second transistor having a second gate, a second source and a second drain; the second gate coupled to the second supply voltage, one of the second source and the second drain coupled to the first transmitting node and the other coupled to the first gate;

a third transistor having a third gate, a third source and a third drain; the third gate coupled to the first transmitting node, one of the third source and the third drain coupled to the second supply voltage and the other coupled to the first gate; and a fourth transistor having a fourth gate, a fourth source and a fourth drain; the fourth gate coupled to the second supply voltage, one of the fourth source and the fourth drain coupled to the first transmitting node and the other coupled to the second transmitting node.

* * * * *